United States Patent [19]

Emoto

[11] Patent Number: 4,862,344
[45] Date of Patent: Aug. 29, 1989

[54] 3-PHASE BRIDGE CONVERTING CIRCUIT MODULE

[75] Inventor: Takao Emoto, Yokosuka, Japan

[73] Assignee: Kabushiki Kaisha Toshiba, Kawasaki, Japan

[21] Appl. No.: 158,714

[22] Filed: Feb. 22, 1988

[30] Foreign Application Priority Data

Feb. 23, 1987 [JP] Japan ................... 62-37781

[51] Int. Cl.$^4$ ............................. G05B 11/01
[52] U.S. Cl. ................... 363/147; 363/146
[58] Field of Search ............. 174/52 FP; 357/74, 75, 357/76, 80; 361/392, 393, 394; 363/144, 146, 147

[56] References Cited

U.S. PATENT DOCUMENTS 3,081,424  3/1963  Dortost ........................... 363/144
4,458,305  7/1984  Buckle et al. .................... 363/144

FOREIGN PATENT DOCUMENTS 0058852   9/1982  European Pat. Off. .
0064856  11/1982  European Pat. Off. .
2940148   4/1980  Fed. Rep. of Germany .
3336979A1  4/1984  Fed. Rep. of Germany .
3516995A1 11/1985  Fed. Rep. of Germany .
57-15442(A)  1/1982  Japan .

Primary Examiner—Patrick R. Salce
Assistant Examiner—Jeffrey Sterrett
Attorney, Agent, or Firm—Finnegan, Henderson, Farabow, Garrett, & Dunner

[57] ABSTRACT

A 3-phase bridge converting circuit module having six switches, leads connected to the control input terminal of each switch, a lead connected to one terminal of each of the first to third switches, three AC phase leads connected to another terminal of each of the first to third switches, the fourth to sixth switches each connected to one of the AC phase leads, and a lead connected to other terminals of the fourth to sixth switches. A SIP type package seals the inner lead sections of the leads and the six switches. The control leads of the fourth to sixth switches and the lead connected to the other terminals of the fourth to sixth switches are arranged adjacent to one another or a pair of the control lead for the first switch and the first AC phase lead, a pair of the control lead for the second switch and the second AC phase lead, and a pair of the control lead for the third switch and the third AC phase lead are arranged adjacent to one another.

22 Claims, 4 Drawing Sheets

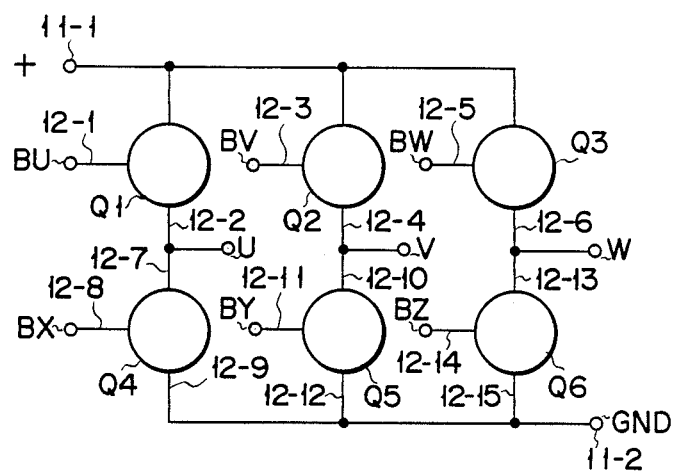
F I G. 2
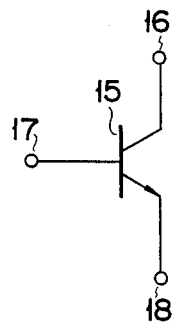
F I G. 3
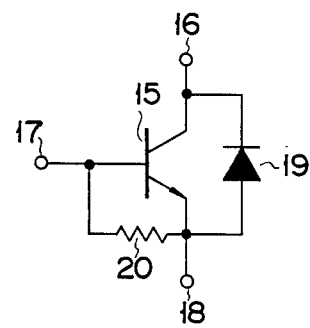
F I G. 4
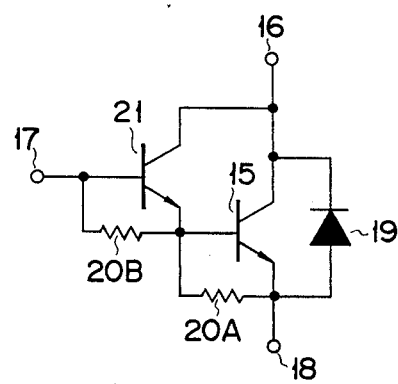
F I G. 5

3-PHASE BRIDGE CONVERTING CIRCUIT MODULE

BACKGROUND OF THE INVENTION

1. Field of the Invention

This invention relates to a 3-phase bridge converting circuit module sealed in a single in-line package (SIP) type package, and more particularly to a 3-phase bridge converting circuit module which can be mounted on a printed circuit (PC) board with a desired arrangement of outer leads.

2. Description of the related art including information disclosed under section 1.97–1.99.

A 3-phase bridge converting circuit module such as a 3-phase bridge inverter circuit includes six transistors. Any set of two out of the six transistors makes a pair to form three inverter circuits. The six transistors are mounted on a lead frame and sealed in a package. The six transistors mounted on the lead frame are arranged in the order of first, fourth, second, fifth, third and sixth transistors. That is, the outer leads connected to the respective transistors are not arranged to correspond to the order of generation of the output signals or the output stages. The first to sixth transistors are arranged in the order as described above in order to simplify the internal connection in the package. With this construction, the pattern of the lead frame can be simplified and the lead frame can be easily formed, and therefore this type of construction is widely used. In addition to the 3-phase bridge inverter circuit, this also applies to other 3-phase bridging converting circuit modules.

In general use, the SIP type package is often directly soldered on the PC board in order to reduce the number of manufacturing steps thus attaining a low manufacturing cost and reducing the size of the device. For the same reason, the SIP package of the 3-phase bridge inverter circuit is directly soldered on the PC board. However, as described before, the outer leads of the SIP type package are not arranged in the order of generation of the output signals. Therefore, when the SIP package is mounted on the PC board, the circuit pattern on the PC board will be complicated. Further, if the circuit pattern on the PC board cannot satisfy the circuit connection, it becomes necessary to additionally form a wiring connection using jumper lines such as short lead lines in addition to the circuit pattern on the PC board. Thus, the step for mounting the module on the PC board will be complicated.

Further, in the case where the first to sixth transistors (semiconductor elements) are large power elements in which a large current will flow, it will be necessary to use a wide wiring pattern as the circuit pattern on the PC board. However, if the circuit pattern becomes complicated, such a wide wiring pattern cannot be used. Therefore, it is difficult to use this type of 3-phase bridge inverter circuit for the large power elements.

SUMMARY OF THE INVENTION

An object of this invention is to provide a 3-phase bridge converting circuit module which can be used for large power elements and in which the circuit pattern on the PC board can be simplified and the mounting process can be simplified by properly modifying the arrangement of the outer leads of the SIP type package.

According to one embodiment of this invention, there is provided a 3-phase bridge converting circuit module which comprises a first lead; a first switching circuit connected at one terminal to the first lead; a second lead BU connected to a control input terminal of the first switching circuit; a third lead U connected to the other terminal of the first switching circuit; a second switching circuit connected at one terminal to the first lead; a fourth lead BV connected to a control input terminal of the second switching circuit; a fifth lead V connected to the other terminal of the second switching circuit; a third switching circuit connected at one terminal to the first lead; a sixth lead BW connected to a control input terminal of the third switching circuit; a seventh lead W connected to the other terminal of the third switching circuit; a fourth switching circuit connected at one terminal to the third lead U; an eighth lead BX connected to a control input terminal of the fourth switching circuit; a fifth switching circuit connected at one terminal to the fifth lead V; a ninth lead BY connected to a control input terminal of the fifth switching circuit; a sixth switching circuit connected at one terminal to the seventh lead W; a tenth lead BZ connected to a control input terminal of the sixth switching circuit; and eleventh lead connected to the other terminals of the fourth to sixth switching circuits; and an SIP type package for sealing the inner lead sections of the first to eleventh leads and the first to sixth switching circuits; wherein the eighth lead BX, a ninth lead BY, tenth lead BZ and eleventh lead are arranged adjacent to one another.

According to another embodiment of this invention, there is provided a 3-phase bridge converting circuit module which comprises a first lead; a first switching circuit connected at one terminal to the first lead; a second lead BU connected to a control input terminal of the first switching circuit; a third lead U connected to the other terminal of the first switching circuit; a second switching circuit connected at one terminal to the first lead; a fourth lead BV connected to a control input terminal of the second switching circuit; a fifth lead V connected to the other terminal of the second switching circuit; a third switching circuit connected at one terminal to the first lead; a sixth lead BW connected to a control input terminal of the third switching circuit; a seventh lead W connected to the other terminal of the third switching circuit; a fourth switching circuit connected at one terminal to the third lead U; an eighth lead BX connected to a control input terminal of the fourth switching circuit; a fifth switching circuit connected at one terminal to the fifth lead V; a ninth lead BY connected to a control input terminal of the fifth switching circuit; a sixth switching circuit connected at one terminal to the seventh lead W; a tenth lead BZ connected to a control input terminal of the sixth switching circuit; an eleventh lead connected to the other terminals of the fourth to sixth switching circuits; and an SIP type package for sealing the inner lead sections of the first to eleventh leads and the first to sixth switching circuits; wherein a pair of the second lead BU and third lead U, a pair of the fourth lead BV and fifth lead V, and a pair of the sixth lead BW and seventh lead W are arranged adjacent to one another.

With this construction, since a complicated wiring of the 3-phase bridge converting circuit module is arranged on the bridge wiring side or in the module, and the outer leads are arranged in the order of generation of output signals, the circuit pattern on the PC board can be simplified. Therefore, it is not necessary to effect the wiring connection using jumper lines or the like and the mounting step can be simplified. Further, the circuit pattern can be made wide due to the simplification of the circuit pattern on the PC board, and therefore the 3-phase bridge converting circuit module can be used for large power elements.

BRIEF DESCRIPTION OF THE DRAWINGS

FIG. 2 is a circuit diagram of the 3-phase bridge converting circuit module shown in FIGS. 1A and 1B and formed to function as a 3-phase bridge inverting circuit;

FIGS. 3 to 5 are circuit diagrams showing the constructions of switching circuits in the circuit of FIG. 2;

DETAILED DESCRIPTION OF THE PREFERRED EMBODIMENTS

Figures 1A, 1B:
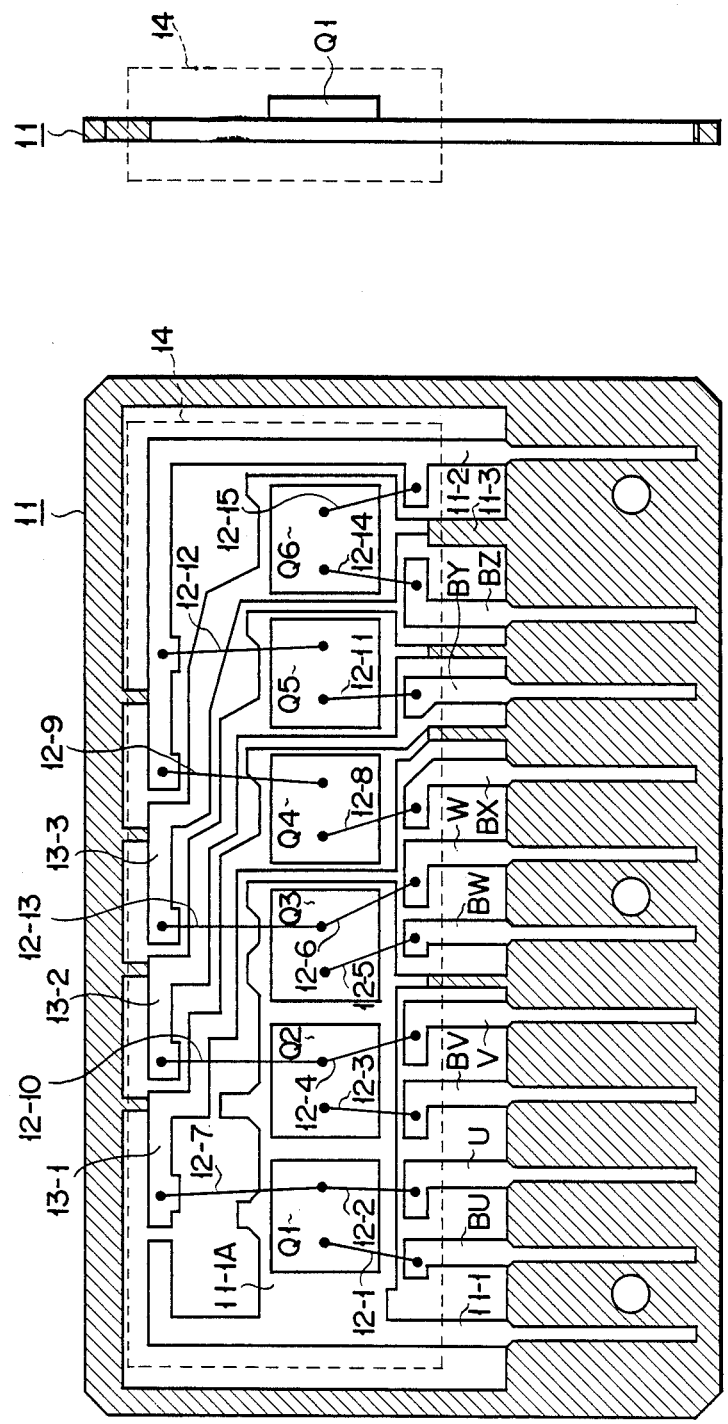
FIG. 1A is a plan view of a semiconductor structure obtained in an assembling step of a 3-phase bridge converting circuit module according to one embodiment of this invention.
FIG. 1B is a side view of the 3-phase bridge converting circuit module shown in FIG. 1A.

FIG 1A is a plan view of a semiconductor structure obtained in an assembling step of a 3-phase bridge converting circuit module according to one embodiment of this invention; and FIG. 1B is a side view of the 3-phase bridge converting circuit module shown in FIG. 1A. Lead frame 11 is formed of, for example, copper by punching a metal sheet with a thickness of 0.8 mm. The portion of lead frame 11 which is hatched in FIG. 1A is removed at the time of completion of the module. Switching circuits are formed on semiconductor chips Q1 to Q6. Outer lead 11-1 of lead frame 11 has mounting portion 11-1A for the semiconductor chips. Semiconductor chips Q1 to Q3 are mounted on mounting portion 11-1A by solder of Pb-Sb or the like. As a result, the first electrode (one terminal) of each of semiconductor chips Q1 to Q3 is connected to outer lead 11-1. Outer lead BU of lead frame 11 and the second electrode (control input terminal) of semiconductor chip Q1 are connected together by bonding wire 12-1 of Al or the like. The wire bonding is attained by, for example, pressure bonding (US bonding) Outer lead U of lead frame 11 and the third electrode (the other terminal) of semiconductor chip Q1 are connected together by bonding wire 12-2. Outer lead BV of lead frame 11 and the second electrode of semiconductor chip Q2 are connected together by bonding wire 12-3. Outer lead V of lead frame 11 and the third electrode of semiconductor chip Q2 are connected together by bonding wire 12-4. Outer lead BW of lead frame 11 and the second electrode of semiconductor chip Q3 are connected together by bonding wire 12-5. Outer lead W of lead frame 11 and the third electrode of semiconductor chip Q3 are connected together by bonding wire 12-6. Semiconductor chip Q4 is mounted on lead 13-1 which is not externally derived. Lead 13-1 and the third electrode of semiconductor chip Q1 are connected together by bonding wire 12-7. Therefore, the first electrode of semiconductor chip Q4 is connected to outer lead U via lead 13-1, bonding wire 12-7, and bonding wire 12-2. Outer lead BX and the second electrode of semiconductor chip Q4 are connected together by bonding wire 12-8. Outer lead 11-2 and the third electrode of semiconductor chip Q4 are connected together by bonding wire 12-9. Semiconductor chip Q5 is mounted on lead 13-2 which is not externally derived. Lead 13-2 and the third electrode of semiconductor chip Q2 are connected together by bonding wire 12-10. Therefore, the first electrode of semiconductor chip Q5 is connected to outer lead V via lead 13-2, bonding wire 12-10, and bonding wire 12-4. Outer lead BY and the second electrode of semiconductor chip Q5 are connected together by bonding wire 12-11. Outer lead 11-2 and the third electrode of semiconductor chip Q5 are connected together by bonding wire 12-12. Semiconductor chip Q6 is mounted on lead 13-3 which is not externally derived. Lead 13-3 and the third electrode of semiconductor chip Q3 are connected together by bonding wire 12-13. Therefore, the first electrode of semiconductor chip Q6 is connected to outer lead W via lead 13-3, bonding wire 12-13, and bonding wire 12-6. Outer lead BZ and the second electrode of semiconductor chip Q6 are connected together by bonding wire 12-14. Outer lead 11-2 and the third electrode of semiconductor chip Q6 are connected together by bonding wire 12-15.

Semiconductor chips Q1 to Q6 and the inner lead of lead frame 11 are sealed in SIP type package 14 (shown by broken lines).

In FIG. 1A, outer lead 11-3 is cut off inside package 14 and is not used for the circuit operation.

FIG. 2 is a circuit diagram of the module shown in FIGS. 1A and 1B and formed to function as a 3-phase bridge inverting circuit. In FIG. 2, portions corresponding to those in FIGS. 1A and 1B are denoted by the same numerals In the case of a 3-phase bridge inverter circuit, a positive DC power source + is connected to outer lead 11-1 and the ground terminal is connected to outer lead 11-2. Outer leads U, V and W are used as 3-phase output terminals. Outer leads BU, BV, BW, BX, BY and BZ are used as control input terminals. Thus, 3-phase signals are output from outer leads U, V and W according to control signals from outer leads BU, BV, BW, BX, BY and BZ.

FIGS. 3 to 5 shown the construction of switching circuits formed in semiconductor chips Q1 to Q6 shown in FIG. 2. FIG. 3 shows the switching circuit formed of NPN type bipolar transistor 15. In the case where bipolar transistor 15 is used to form each of the switching circuits in semiconductor chips Q1 to Q3, collector terminals (corresponding to the first electrode described above) 16 of transistors 15 are commonly connected to outer lead 11-1, base terminals (corresponding to the second electrode described above) 17 are respectively connected to outer leads BU, BV and BW, and emitter terminals (corresponding to the third electrode described above) 18 are respectively connected to outer leads U, V and W. In the switching circuits of semiconductor chips Q4 to Q6, collector terminals 16 of transistor 15 are respectively connected to outer leads U, V and W, base terminals 17 are respectively connected to outer leads BX, BY and BZ, and emitter terminals 18 are commonly connected to outer lead 11-2.

FIG. 4 shows another construction of the switching circuit described above. In this example, protection diode 19 is connected to NPN type bipolar transistor 15 shown in FIG. 3. The anode of diode 19 is connected to the emitter of transistor 15 and the cathode is connected to the collector. The switching circuit of FIG. 4 is preferably used in the case where the inductance load is driven by 3-phase signals generated from outer leads U, V and W. For example, in the case where the inductance load of a 3-phase AC motor or the like is driven, a counter electromotive force is generated at the time of interruption of current supply. At this time, diode 19 permits the counter electromotive force to be transmitted from the positive terminal + to the ground therethrough, thus protecting transistor 15. Resistor 20 connected between the base and emitter of transistor 15 can be obtained as a parasitic resistance at the time of manufacturing the semiconductor chip. When the switching circuit is used for the circuit of FIG. 2, terminals 16, 17 and 18 are connected in the same manner as described with reference to the circuit of FIG. 3.

In FIG. 5, NPN type bipolar transistor 21 is additionally connected to NPN type bipolar transistor 15 in the circuit of FIG. 4 in a Darlington fashion. Resistor 20A connected between the base and emitter of transistor 15, and resistor 20B connected between the base and emitter of transistor 21 can be obtained as a parasitic resistance at the time of manufacturing the semiconductor chip. In the switching circuit of this construction, even when each control signal supplied via outer leads BU, BV, BW, BX, BY and BZ are at a low level, the control signal is amplified by Darlington connected transistors 21 and 15 so that a sufficiently large driving ability can be attained. When the switching circuit is used for the circuit of FIG. 2, terminals 16, 17 and 18 are connected in the same manner as described with reference to the circuits of FIGS. 3 and 4.

Figure 6:
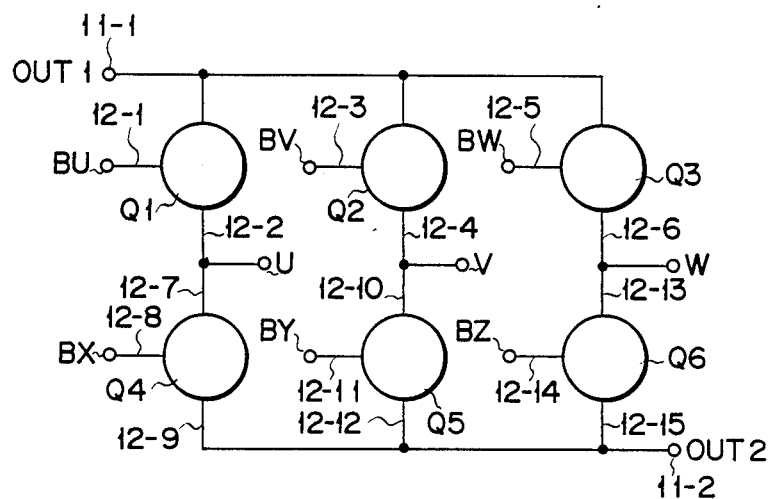
FIG. 6 is a circuit diagram of the 3-phase bridge converting circuit module shown in FIGS. 1A and 1B and formed to function as an AC-DC converting circuit.

FIG. 6 shows the construction of a circuit obtained in the case where the module shown in FIGS. 1A and 1B is used as a 3-phase bridge converting circuit for AC-DC conversion. In this case, outer leads 11-1 and 11-2 are used as DC output terminals OUT1 and OUT2. Outer leads U, V and W are used as input terminals for 3-phase signals. Outer leads BU, BV, BW, BX, BY and BZ are used as control input terminals.

Figure 7:
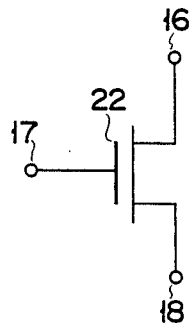
FIGS. 7 and 8 are circuit diagrams showing the constructions of switching circuits in the circuit of FIG. 6.
Figure 8:
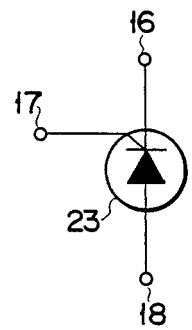

FIGS. 7 and 8 show the construction of switching circuits formed in semiconductor chips of FIG. 6. FIG. 7 shows the switching circuit formed of MOSFET 22. In the switching circuits semiconductor chips Q1 to Q3, source terminals 16 of the MOSFET are commonly connected to outer lead 11-1, gate terminals 17 are respectively connected to outer leads BU, BV and BW, and drain terminals 18 are respectively connected to outer leads U, V and W. In the switching circuits of semiconductor chips Q4 to Q6, drain terminals 18 of MOSFET 22 are respectively connected to outer leads U, V and W, gate terminals 17 are respectively connected to outer leads BX, BY and BZ, and source terminals 16 are commonly connected to outer lead 11-2.

FIG. 8 shows the switching circuits formed to function as thyristor 23. In the switching circuits semiconductor chips Q1 to Q3, cathode terminals 16 of thyristor 23 are commonly connected to outer lead 11-1, gate terminals 17 are respectively connected to outer leads BU, BV and BW, and anode terminals 18 are respectively connected to outer leads U, V and W. In the switching circuits of semiconductor chips Q4 to Q6, cathode terminals 16 of thyristor 23 are respectively connected to outer lead 11-2, gate terminals 17 are respectively connected to outer leads BX, BY and BZ, and anode terminals 18 are commonly connected to outer leads U, V and W.

With this construction, a complicated wiring of the 3-phase bridge converting circuit module is arranged on the bridge wiring side or in the module. This permits pairs of outer leads BU and U; BV and V and BW and W to be arranged together and outer leads BX, BY, BZ and 11-2 to be arranged together. Further, since outer leads U, V and W are arranged in the order of generation of output signals, the circuit pattern on the PC board can be simplified. It is not necessary to additionally provide a wiring using jumper lines or the like and the mounting step can be simplified. Further, the circuit pattern can be made wide due to the simplification of the circuit pattern on the PC board, and therefore the 3-phase bridge converting circuit module can be used for large power elements.

It is not always necessary to arrange outer leads BU, U, BV, V, BW and W in the order described above, and it is only necessary to arrange to make pairs of outer leads BU and U; BV and V; and BW and W. Further, it is not necessary to arrange outer leads BX, BY, BZ and 11-2 in the order described above, but it is necessary to arrange outer leads BX, BY, BW and 11-2 together in one place. Since voltage applied to outer leads BX, BY, BZ and 11-2 is low, the outer leads can be arranged with a small distance from one another in order to reduce the size of the SIP package.

Figures 9A, 9B:
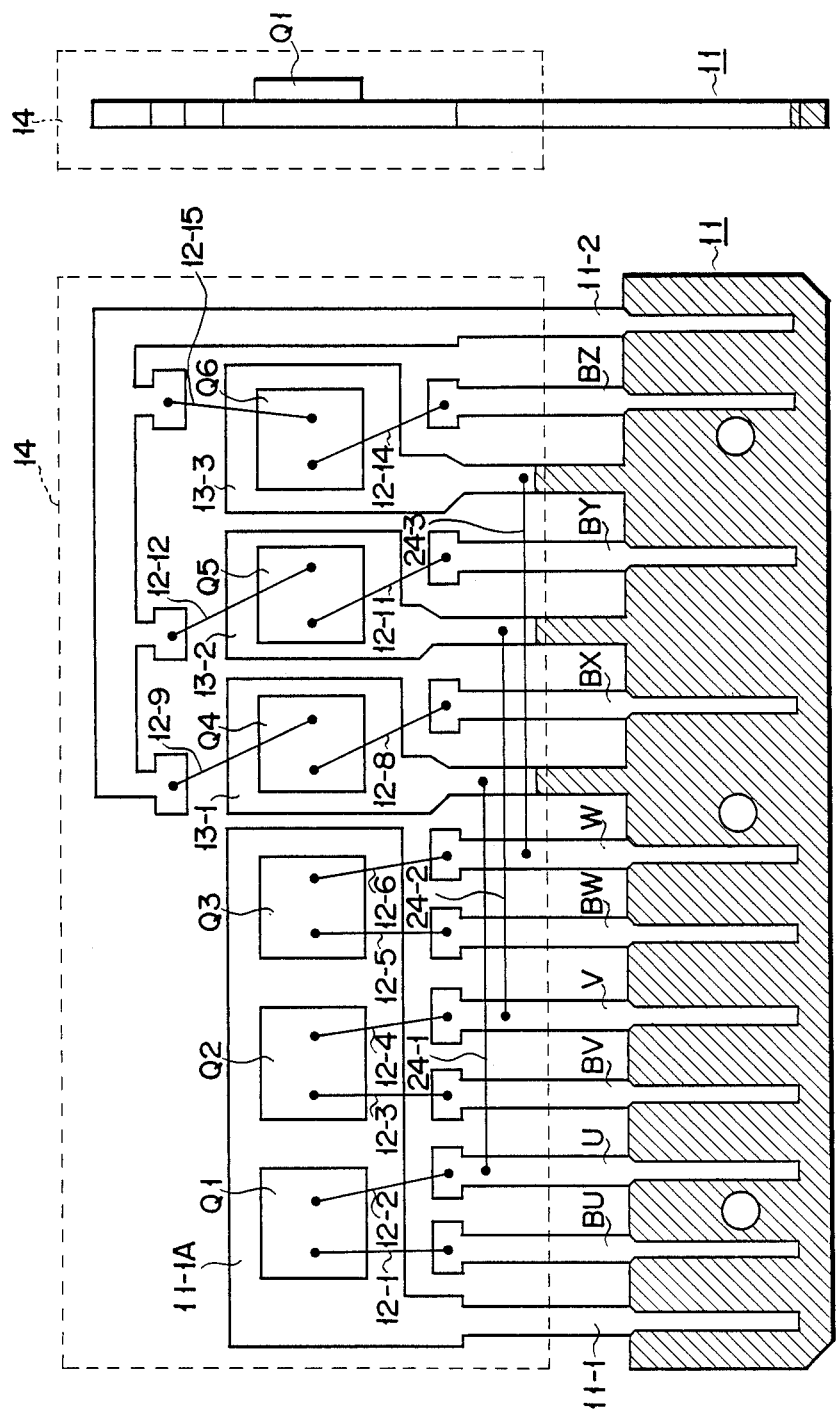
FIG. 9A is a plan view of a semiconductor structure obtained in an assembling step of a 3-phase bridge converting circuit module according to another embodiment of this invention.
FIG. 9B is a side view of the 3-phase bridge converting circuit module shown in FIG. 9A.

FIGS. 9A and 9B are plan and side views of a semiconductor structure obtained in an assembling step of a 3-phase bridge converting circuit module according to another embodiment of this invention. In FIGS. 9A and 9B, those portions which correspond to portions of FIGS. 1A and 1B are denoted by the same numerals. The semiconductor structure of FIGS. 9A and 9B is simpler than that of FIGS. 1A and 1B except for the form of the pattern of lead frame 11 and the wiring pattern. The arrangement of outer leads 11-1, BU, U, BV, V, BW, W, BX, BY and BZ is the same as in FIGS. 1A and 1B. That is, lead 13-1 and outer lead U are connected together by means of bonding wire 24-1 instead of using lead 13-1 and bonding wire 12-7, 12-2 to connect one terminal of semiconductor chip Q4 and outer lead U together. Lead 13-2 and outer lead V are connected together by means of bonding wire 24-2 instead of using lead 13-2 and bonding wire 12-10, 12-4 to connect one terminal of semiconductor chip Q5 and outer lead V together. Further, lead 13-3 and outer lead W are connected together by means of bonding wire 24-3 instead of using lead 13-3 and bonding wire 12-13, 12-6 to connect one terminal of semiconductor chip Q6 and outer lead W together. Connections between leads 13-1 to 13-3 and outer leads U, V and W are effected inside package 14.

With this construction, since a complicated wiring of the 3-phase bridge converting circuit module is arranged on the bridge wiring side or in the module and outer leads are arranged in the order of generation of output signals, the circuit pattern on the PC board can be simplified. Since it is not necessary to additionally provide a wiring using jumper lines or the like, the mounting step can be simplified. Further, the circuit pattern can be made wide due to the simplification of the circuit pattern on the PC board, and therefore the 3-phase bridge converting circuit module can be used for large power elements.

In the embodiment of FIGS. 9A and 9B, connection is made by means of bonding wires 24-1 to 24-3. However, it is possible to weld a jumper wiring board to attain the same connection.

What is claimed is:

1. A 3-phase bridge converting circuit module comprising:

a first lead;

first switching means having a control input terminal and connected at one terminal to said first lead;

a second lead connected to the control input terminal of said first switching means;

a third lead connected to another terminal of said first switching means;

second switching means having a control input terminal and connected at one terminal to said first lead;

a fourth lead connected to the control input terminal of said second switching means;

a fifth lead connected to another terminal of said second switching means;

third switching means having a control input terminal and connected at one terminal to said first lead;

a sixth lead connected to the control input terminal of said third switching means;

a seventh lead connected to another terminal of said third switching means;

fourth switching means having a control input terminal and connected at one terminal to said third lead;

an eighth lead connected to the control input terminal of said fourth switching means;

fifth switching means having a control input terminal and connected at one terminal to said fifth lead;

a ninth lead connected to the control input terminal of said fifth switching means;

sixth switching means having a control input terminal and connected at one terminal to said seventh lead;

a tenth lead connected to the control input terminal of said sixth switching means;

an eleventh lead connected to the other terminals of said fourth to sixth switching means; and a SIP type package for sealing therein the inner lead sections of said first to eleventh leads and said first to sixth switching means; with said eighth lead, ninth lead, tenth lead and eleventh lead arranged adjacent to one another.

2. A 3-phase bridge converting circuit module according to claim 1, wherein said first lead is used as a DC power source terminal; said eleventh lead is used as a ground terminal; and said third lead, fifth lead W and seventh lead W are used as AC output terminals.

3. A 3-phase bridge converting circuit module according to claim 2, wherein each of said first to sixth switching means includes one bipolar transistor.

4. A 3-phase bridge converting circuit module according to claim 2, wherein each of said first to sixth switching means includes a bipolar transistor and a diode having an anode connected to the emitter of said transistor and a cathode connected to the collector of said transistor.

5. A 3-phase bridge converting circuit module according to claim 2, wherein each of said first to sixth switching means includes a first bipolar transistor and a second bipolar transistor connected to said first bipolar transistor in a Darlington fashion.

6. A 3-phase bridge converting circuit module according to claim 2, wherein each of said first to sixth switching means includes a first bipolar transistor; a second bipolar transistor connected to said first bipolar transistor in a Darlington fashion; and a diode having anode and cathode respectively connected to the emitter and collector of said bipolar transistor.

7. A 3-phase bridge converting circuit module according to claim 1, wherein said first lead is used as a first DC output terminal; said eleventh lead is used as a second DC output terminal; and said third lead, fifth lead W and seventh lead W are used as AC input terminals.

8. A 3-phase bridge converting circuit module according to claim 7, wherein each of said first to sixth switching means includes a MOSFET.

9. A 3-phase bridge converting circuit module according to claim 7, wherein each of said first to sixth switching means includes a thyristor.

10. A 3-phase bridge converting circuit module according to claim 1, further comprising a twelfth lead which is located completely inside said SIP type package and which has a mounting section for mounting said fourth switching means; a thirteenth lead which is located completely inside said SIP type package and which has a mounting section for mounting said fifth switching means; a fourteenth lead which is located completely inside said SIP type package and which has a mounting section for mounting said sixth switching means; and first to fifteenth bonding wires; and wherein said first lead has first, second and third mounting sections for mounting said first to third switching means; said first lead is connected to said one terminal of said first switching means via said first mounting section of said first lead; the control input terminal of said first switching means is connected to said second lead via said first bonding wire; said other terminal of said first switching means is connected to said third lead via said second bonding wire; said first lead is connected to said one terminal of said second switching means via said second mounting section of said first lead; the control input terminal of said second switching means is connected to said fourth lead via said third bonding wire; said other terminal of said second switching means is connected to said fifth lead via said fourth bonding wire; said first lead is connected to said one terminal of said third switching means via said third mounting section of said first lead; the control input terminal of said third switching means is connected to said sixth lead via said fifth bonding wire; said other terminal of said third switching means is connected to said seventh lead via said sixth bonding wire; said third lead is connected to said one terminal of said fourth switching means via said twelfth lead on which said fourth switching means is mounted, said seventh bonding wire and said second bonding wire; the control input terminal of said fourth switching means is connected to said eighth lead via said eighth bonding wire; said other terminal of said fourth switching means is connected to said eleventh lead via said ninth bonding wire; said fifth lead is connected to said one terminal of said fifth switching means via said thirteenth lead on which said fifth switching means is mounted, said tenth bonding wire and said fourth bonding wire; the control input terminal of said fifth switching means is connected to said ninth lead via said eleventh bonding wire; said other terminal of said fifth switching means is connected to said eleventh lead via said twelfth bonding wire; said seventh lead is connected to said one terminal of said sixth switching means via said fourteenth lead on which said sixth switching means is mounted, said thirteenth bonding wire and said sixth bonding wire; the control input terminal of said sixth switching means is connected to said tenth lead via said fourteenth bonding wire; and said other terminal of said sixth switching means is connected to said eleventh lead via said fifteenth bonding wire.

11. A 3-phase bridge converting circuit module according to claim 1, further comprising a twelfth lead which is located completely inside said SIP type package and which has a mounting section for mounting said fourth switching means; a thirteenth lead which is located completely inside said SIP type package and which has a mounting section for mounting said fifth switching means; fourteenth lead which is located completely inside said SIP type package and which has a mounting section for mounting said sixth switching means; and first to fifteenth bonding wires; and wherein said first lead has first, second and third mounting sections for mounting said first to third switching means; said first lead is connected to said one terminal of said first switching means via said first mounting section of said first lead; the control input terminal of said first switching means is connected to said second lead via said first bonding wire; said other terminal of said first switching means is connected to said third lead via said second bonding wire; said first lead is connected to said one terminal of said second switching means via said second mounting section of said first lead; the control input terminal of said second switching means is connected to said fourth lead via said third bonding wire; said other terminal of said second switching means is connected to said fifth lead via said fourth bonding wire; said first lead is connected to said one terminal of said third switching means via said third mounting section of said first lead; the control input terminal of said third switching means is connected to said sixth lead via said fifth bonding wire; said other terminal of said third switching means is connected to said seventh lead via said sixth bonding wire; said third lead is connected to said one terminal of said fourth switching means via said twelfth lead on which said fourth switching means is mounted and said seventh bonding wires; the control input terminal of said fourth switching means is connected to said eighth lead via said eighth bonding wire; said other terminal of said fourth switching means is connected to said eleventh lead via said ninth bonding wire; said fifth lead is connected to said one terminal of said fifth switching means via said thirteenth lead on which said fifth switching means is mounted and said tenth bonding wire; the control input terminal of said fifth switching means is connected to said ninth lead via said eleventh bonding wire; said other terminal of said fifth switching means is connected to said eleventh lead via said twelfth bonding wire; said eleventh lead is connected to said one terminal of said sixth switching means via said fourteenth lead on which said sixth switching means is mounted and said thirteenth bonding wire; the control input terminal of said sixth switching means is connected to said tenth lead via said fourteenth bonding wire; and said other terminal of said sixth switching means is connected to said eleventh lead via said fifteenth bonding wire.

12. A 3-phase bridge converting circuit module comprising:
a first lead;
first switching means having a control input terminal and connected at one terminal to said first lead;
a second lead connected to the control input terminal of said first switching means;
a third lead connected to another terminal of said first switching means;
second switching means having a control input terminal and connected at one terminal to said first lead;
a fourth lead connected to the control input terminal of said second switching means;
a fifth lead connected to another terminal of said second switching means;
third switching means having a control input terminal and connected at one terminal to said first lead;
a sixth lead connected to the control input terminal of said third switching means;
a seventh lead connected to another terminal of said third switching means;
fourth switching means having a control input terminal and connected at one terminal to said third lead;
an eighth lead connected o the control input terminal of said fourth switching means;
fifth switching means having a control input terminal and connected at one terminal to said fifth lead;
a ninth lead connected to the control input terminal of said fifth switching means;
sixth switching means having a control input terminal and connected at one terminal to said seventh lead;
a tenth lead connected to the control input terminal of said sixth switching means;
an eleventh lead connected to the other terminals of said fourth to sixth switching means; and
a SIP type package for sealing therein the inner lead sections of said first to eleventh leads and said first to sixth switching means; with a pair of said second lead and third lead, a pair of said fourth lead and fifth lead, and a pair of said sixth lead and seventh lead arranged adjacent to one another.

13. A 3-phase bridge converting circuit module according to claim 12, wherein said first lead is used as a DC power source terminal; said eleventh lead is used as a ground terminal; and said third lead, fifth lead W and seventh lead W are used as AC output terminals.

14. A 3-phase bridge converting circuit module according to claim 13, wherein each of said first to sixth switching means includes one bipolar transistor.

15. A 3-phase bridge converting circuit module according to claim 13, wherein each of said first to sixth switching means includes a bipolar transistor and a diode having an anode connected to the emitter of said transistor and a cathode connected to the collector of said transistor.

16. A 3-phase bridge converting circuit module according to claim 13, wherein each of said first to sixth switching means includes a first bipolar transistor and a second bipolar transistor connected to said first bipolar transistor in a Darlington fashion.

17. A 3-phase bridge converting circuit module according to claim 13, wherein each of said first to sixth switching means includes a first bipolar transistor; a second bipolar transistor connected to said first bipolar transistor in a Darlington fashion; and a diode having anode and cathode respectively connected to the emitter and collector of said first bipolar transistor.

18. A 3-phase bridge converting circuit module according to claim 12, wherein said first lead is used as a first DC output terminal; said eleventh lead is used as a second DC output terminal; and said third lead, fifth lead and seventh lead are used as AC input terminals.

19. A 3-phase bridge converting circuit module according to claim 18, wherein each of said first to sixth switching means includes a MOSFET.

20. A 3-phase bridge converting circuit module according to claim 18, wherein each of said first to sixth switching means includes a thyristor.

21. A 3-phase bridge converting circuit module according to claim 12, further comprising a twelfth lead which is located completely inside said SIP type package and which has a mounting section for mounting said fourth switching means; a thirteenth lead which is located completely inside said SIP type package and which has a mounting section for mounting said fifth switching means; fourteenth lead which is located completely inside said SIP type package and which has a mounting section for mounting said sixth switching means; and first to fifteenth bonding wires; and wherein said first lead has first, second and third mounting sections for mounting said first to third switching means; said first lead is connected to said one terminal of said first switching means via said first mounting section of said first lead; the control input terminal of said first switching means is connected to said second lead via said first bonding wire; said other terminal of said first switching means is connected to said third lead via said second bonding wire; said first lead is connected to said one terminal of said second switching means via said second mounting section of said first lead; the control input terminal of said second switching means is connected to said fourth lead via said third bonding wire; said other terminal of said second switching means is connected to said fifth lead via said fourth bonding wire; said first lead is connected to said one terminal of said third switching means via said third mounting section of said first lead; the control input terminal of said third switching means is connected to said sixth lead via said fifth bonding wire; said other terminal of said third switching means is connected to said seventh lead via said sixth bonding wire; said third lead is connected to said one terminal of said fourth switching means via said twelfth lead on which said fourth switching means is mounted, said seventh bonding wire and said second bonding wire; the control input terminal of said fourth switching means is connected to said eighth lead via said eighth bonding wire; said other terminal of said fourth switching means is connected to said eleventh lead via said ninth bonding wire; said fifth lead is connected to said one terminal of said fifth switching means via said thirteenth lead on which said fifth switching means is mounted, said tenth bonding wire and said fourth bonding wire; the control input terminal of said fifth switching means is connected to said ninth lead via said eleventh bonding wire; said other terminal of said fifth switching means is connected to said eleventh lead via said twelfth bonding wire; said seventh lead is connected to said one terminal of said sixth switching means via said fourteenth lead on which said sixth switching means is mounted, said thirteenth bonding wire and said sixth bonding wire; the control input terminal of said sixth switching means is connected to said tenth lead via said fourteenth bonding wire; and said other terminal of each sixth switching means is connected to said eleventh lead via said fifteenth bonding wire.

22. A 3-phase bridge converting circuit module according to claim 12, further comprising a twelfth lead which is located completely inside said SIP type package and which has a mounting section for mounting said fourth switching means; a thirteenth lead which is located completely inside said SIP type package and which has a mounting section for mounting said fifth switching means; fourteenth lead which is located completely inside said SIP type package and which has a mounting section for mounting said sixth switching means; and first to fifteenth bonding wires; and wherein said first lead has first, second and third mounting sections for mounting said first to third switching means; said first lead is connected to said one terminal of said first switching means via said first mounting section of said first lead; the control input terminal of said first switching means is connected to said second lead via said first bonding wire; said other terminal of said first switching means is connected to said third lead via said second bonding wire; said first lead is connected to said one terminal of said second switching means via said second mounting section of said first lead; the control input terminal of said second switching means is connected to said fourth lead via said third bonding wire; said other terminal of said second switching means is connected to said fifth lead via said fourth bonding wire; said first lead is connected to said one terminal of said third switching means via said third mounting section of said first lead; the control input terminal of said third switching means is connected to said sixth lead via said fifth bonding wire; said other terminal of said third switching means is connected to said seventh lead via said sixth bonding wire; said third lead is connected to said one terminal of said fourth switching means via said twelfth lead on which said fourth switching means is mounted and said seventh bonding wire; the control input terminal of said fourth switching means is connected to said eighth lead via said eighth bonding wire; said other terminal of said fourth switching means is connected to said eleventh lead via said ninth bonding wire; said fifth lead is connected to said one terminal of said fifth switching means via said thirteenth lead on which said fifth switching means is mounted and said tenth bonding wire; the control input terminal of said fifth switching means is connected to said ninth lead via said eleventh bonding wire; said other terminal of said fifth switching means is connected to said eleventh lead via said twelfth bonding wire; said seventh lead is connected to said one terminal of said sixth switching means via said fourteenth lead on which said sixth switching means is mounted and said thirteenth bonding wire; the control input terminal of said sixth switching means is connected to said tenth lead via said fourteenth bonding wires; and said other terminal of said sixth switching means is connected to said eleventh lead via said fifteenth bonding wire.

* * * * *

UNITED STATES PATENT AND TRADEMARK OFFICE
CERTIFICATE OF CORRECTION

PATENT NO. : 4,862,344
DATED : August 29, 1989
INVENTOR(S) : Takao Emoto

It is certified that error appears in the above-identified patent and that said Letters Patent is hereby corrected as shown below:

Claim 2, Column 7, Lines 49-50, change "fifth lead W and seventh lead W" to -- fifth lead and seventh lead--;

Claim 7, Column 8, Line 8, change "fifth lead W and seventh lead W" to -- fifth lead and seventh lead--;

Claim 13, Column 10, Lines 48-49, change "fifth lead W and seventh lead W" to -- fifth lead and seventh lead--;

Claim 12, Column 10, Line 26, change "o" to --to--.

Signed and Sealed this

Ninth Day of June, 1992

*Attest:*

DOUGLAS B. COMER

*Attesting Officer*  *Acting Commissioner of Patents and Trademarks*